United States Patent
Peng et al.

[11] Patent Number: 5,828,605
[45] Date of Patent: Oct. 27, 1998

[54] SNAPBACK REDUCES THE ELECTRON AND HOLE TRAPPING IN THE TUNNELING OXIDE OF FLASH EEPROM

[75] Inventors: Kuo-Reay Peng, Fauny-San; Jian-Hsing Lee; Juang-Ke Yeh, both of Hsin-Chu; Ming-Chon Ho, Taichung, all of Japan

[73] Assignee: Taiwan Semiconductor Manufacturing Company Ltd., Hsin-Chu, Taiwan

[21] Appl. No.: 949,945

[22] Filed: Oct. 14, 1997

[51] Int. Cl.⁶ ........................... G11C 16/04
[52] U.S. Cl. ............... 365/185.29; 365/185.18; 365/218
[58] Field of Search ............ 365/185.29, 185.18, 365/185.27, 218

[56] References Cited

U.S. PATENT DOCUMENTS

| | | | |
|---|---|---|---|
| 5,042,009 | 8/1991 | Kazerounian et al. | 365/185 |
| 5,410,511 | 4/1995 | Michiyama | 365/218 |
| 5,485,423 | 1/1996 | Tang et al. | 365/185 |
| 5,600,592 | 2/1997 | Atsumi et al. | 365/185.29 |
| 5,726,933 | 3/1998 | Lee et al. | 365/185.29 |
| 5,748,530 | 5/1998 | Gotou et al. | 365/185.29 |
| 5,770,963 | 6/1998 | Akaogi et al. | 365/185.29 |
| 5,781,477 | 7/1998 | Rinerson et al. | 365/185.29 |

OTHER PUBLICATIONS

Feng et al. "MOSFET Drain Breakdown Voltage", IEEE device letters vol. EDL-7 No. 7, Jul. 1986, pp. 449–450.

*Primary Examiner*—Son T. Dinh
*Attorney, Agent, or Firm*—George O. Saile; Stephen B. Ackerman; William J. Stoffel

[57] ABSTRACT

The present invention provides method to erase flash EEPROMS devices using a positive sine waveform (Vs) and negative Vg that drives a cell in to snapback breakdown to remove trapped electron in the tunnel oxide and improve device performance. The snapback breakdown operation of one cell in the array lowers the tunnel oxide electric field for all cells in the array. The snapback breakdown generates a substrate current that reduces the electric field thereby reducing electron and hole trapping. The method comprises the steps of: (a) applying a positive sine waveform voltage (Vs) to a source region of said EEPROM device during an entire erase cycle; (b) grounding a well region of said EEPROM device during an entire erase cycle; (c) grounding a drain region of said EEPROM device during an entire erase cycle; (d) simultaneously applying a negative voltage (Vg) to a control gate of said EEPROM device during the entire erase cycle; and whereby the positive sine waveform to the source region reduce the electric field in a tunnel oxide layer which reduces the electron and hole trapping.

12 Claims, 4 Drawing Sheets

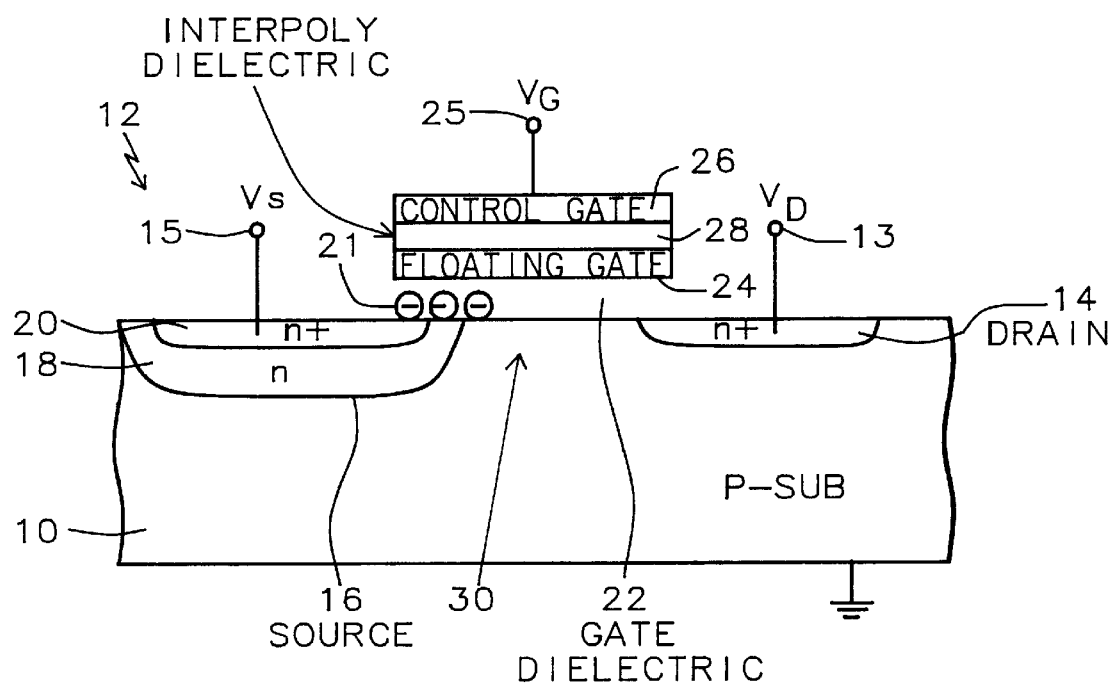
FIG. 1A – Prior Art

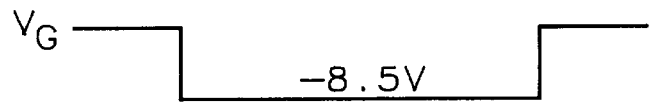
FIG. 2A - Prior Art
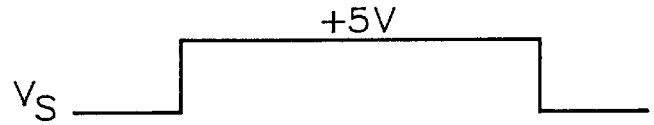
FIG. 2B - Prior Art
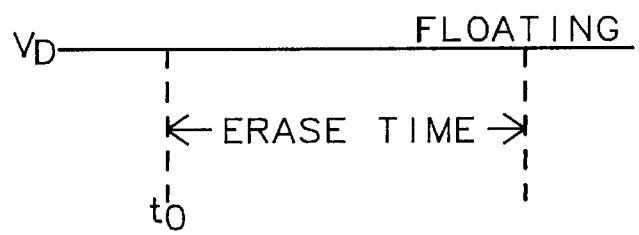
FIG. 2C - Prior Art
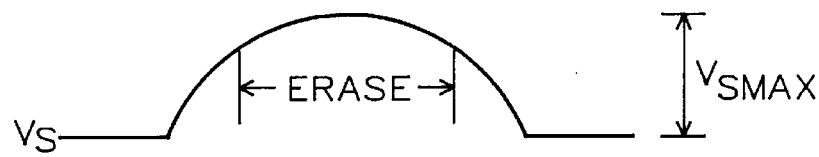
FIG. 3A
FIG. 3B
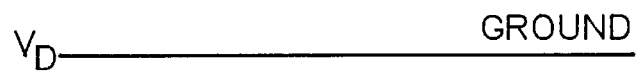
FIG. 3C
FIG. 3D
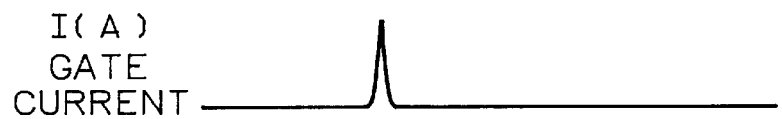
FIG. 3E

| HOT CARRIER GENERATION AND CURRENT COMPONENTS (SHOWN IN FIG. 4B) ||
|---|---|
| ELEMENT NUMBER | ELEMENT |
| 51 | HOLES REACHING THE DRAIN |
| 52 | ELECTRON INJECTION FROM THE DRAIN |
| 53 | SUBSTRATE HOLE CURRENT |
| 54 | ELECTRON INJECTION INTO THE OXIDE |

SNAPBACK REDUCES THE ELECTRON AND HOLE TRAPPING IN THE TUNNELING OXIDE OF FLASH EEPROM

BACKGROUND OF INVENTION

1) Field of the Invention

This invention relates generally to floating gate memory devices such as an array of flash electrically erasable and programmable read-only memory devices (EEPROMS). More particularly, the present invention is directed to a new and improved method for preventing cycling-induced electron and hole trapping in the tunneling oxide of flash EEPROMS.

2) Background of the Invention

Flash EEPROMS have recently emerged as an important memory device by combining the advantages of EPROM density with EEPROM electrical erasability. Such flash EEPROM's provide electrical erasing and a small cell size. FIG. 1A illustrates a prior art cross-sectional view of a flash EEPROM cell 12. The EEPROM cell is formed of a substrate 10, typically of a p-type conductivity, having embedded therein an n+ drain region 14 and a n-type double-diffused source region 16. The double-diffused source region 16 is formed of a deeply diffused but highly doped n-junction 18 and a more heavily doped but shallower n+ junction 20 embedded within the deep n-junction 18. The deeply diffused n-junction 18 is typically formed by using a phosphorus implant, and the shallower junction 20 is typically formed by using an arsenic implant after the phosphorus implant.

A relatively thin gate dielectric layer 22 (i.e., tunnel oxide, oxide having a uniform thickness of about 100 Å) is interposed between the top surface of the substrate 10 and a conductive polysilicon floating gate 24. A polysilicon control gate 26 is insulated above the floating gate 24 by an inter-poly dielectric 28. A channel region 30 in the substrate 10 separates the drain region 14 and the source region 16. Further, there are provided terminal pins 15, 25, and 13 for applying a source voltage Vs to the source region 16, a gate voltage Vg to the control gate 26, and a drain voltage Vd to the drain region 14, respectively.

In conventional operation, the flash EEPROM cell of FIG. 1A is "programmed" by applying a relatively high voltage V, (approximately +9 volts) to the control gate via the terminal pin 25 and a moderately high voltage Vd (approximately +5 volts) to the drain region 14 via the terminal pin 13 in order to produce "hot" (high energy) electrons in the channel 30 near the drain region 14. The source region 16 is connected to a ground potential (Vs=0) via the terminal pin 15. The hot electrons are generated and accelerated across the gate dielectric 22 and onto the floating gate 24 and become trapped in the floating gate since the floating gate is surrounded by insulators. As a result, the floating gate threshold may be increased by three to five volts. This change in the threshold voltage, or channel conductance, of the cell created by the trapped hot electrons is what causes the cell to be programmed.

In order to erase the flash EEPROM cell of FIG. 1A, a positive voltage Vs is applied to the source region 16 via the terminal pin 15 while the control gate 26 via the terminal pin 25 is either grounded (Vg=0) or biased to a negative voltage dependent upon whether the positive voltage Vs applied to the source region 16 has a value of +12 V or +5 V. In a "12 Volt flash EEPROM" device, the bias condition of Vs=+12 V and Vg=0 is used. In a "5 Volt Only flash EEPROM" device, the bias condition of Vs=+5 V and Vg=–8.5 V is used. The drain region 14 is usually allowed to float. Under either of these conditions, a strong electric field is developed across the tunnel oxide between the floating gate and the source region. The electrons trapped in the floating gate flow toward a cluster at the portion of the floating gate overlying the n+-type source region 16 and are extracted from the floating gate 24 to the source region 16 by way of Fowler-Nordheim (F-N) tunneling.

However, some of the electrons 21 will remain trapped in the tunnel oxide 22 adjacent the top surface of the substrate 10 as depicted in FIG. 1A. This electron and hole trapping will occur in the whole memory array and will tend to increase the erase time as a function of the number of program/erase cycles. As the number of program/erase cycles goes beyond the 100,000 number, the erase time required to erase every cell in the entire memory array to a certain threshold $V_T$ in order to pass the erase verify mode of operation will exceed the time limit of 10 seconds. It is generally assumed that if the entire memory array cannot be erased within the time limit of 10 seconds (i.e., 1 pulse/10 ms or 1,000 pulses), a cycling failure is considered to have occurred.

Therefore, the problem of electron and hole trapping in the tunneling oxide to reduce the tunneling electric field for such conventional EEPROM devices is of a major concern since it causes the erase time to be prolonged beyond the limit of 10 seconds (i.e., 1 pulse/10 ms), thereby significantly limiting the endurance of the cells. As used herein, the term "endurance" refers to the number of times the memory cells in the array may be re-programmed and erased. Consequently, the electron and hole trapping problem greatly reduces the endurance of the cells to be less than 100,000. In addition, the hole trapping caused by F-N tunneling current is also a serious issue. The hole trapping in the tunnel oxide will cause the Vt window opening and erratic bit.

In addition, some EEPROMS devices use Fowler-Nordheim (FN) tunneling in both the erase and program cycles. The above electron and hole trapping problem slows the program cycle also. FIGS. 2A–2C, show the conventional square pulse waveforms used in conventional EEPROM erase cycles. The inventor realized that the electron and hole trapping problem could be reduced by modifying the conventional waveforms for erase cycle.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,485,423 (Tang) which shows a method for applying a relative low positive voltage to a source region of an EEPROM during the erase cycle. U.S. Pat. No. 5,042,005 (Kazerounian) shows a method of programming a floating gate using a charge pump to provide a drain current. U.S. Pat. No. 5,410,511 (Michiyama) shows a method of erasing a flash memory. Feng et al, "MOSFET Drain Breakdown Voltage", IEEE device letters vol. EDL-7, no. 7. July 1986, (0741-3106/86/700-0449) pp. 449–450. discusses gate assisted breakdown voltages as affected by Tox and scaling up $N_{sub}$.

However, there is still a need for a method to further eliminate electron and hole trapping in flash EEPROM cells.

SUMMARY OF THE INVENTION

Accordingly, it is a general object of the present invention to provide an improved erasure method to reduce electron and hole trapping in EEPROMS which overcomes the disadvantages of the prior art erase methods.

It is an object of the present invention to provide an improved method for preventing cycling-induced electron and hole trapping in the tunneling oxide of flash EEPROMS which is realized by applying a high magnitude sine waveform for the Vs erase cycles.

It is an object of the present invention to provide an improved method for preventing cycling-induced electron and hole trapping in the tunneling oxide of flash EEPROMS which is realized by applying a high magnitude sine waveform for the Vs erase cycles that drives a cell into snapback breakdown which reduces the electron and hole trapping for all cells in the array.

It is an object of the present invention which is realized by applying a ground to Drain (Vd) that the hole current caused by F-N tunneling will pass the drain junction and drives the cell into snapback breakdown.

To accomplish these objectives, the present invention provides method to erase flash EEPROMS devices using a positive voltage sine waveform Vs applied to the source, a negative voltage applied to the Gate (Vg), and grounding the drain (Vd) that drives a cell to snapback breakdown. The snapback breakdown operation of one cell in the array lowers the tunnel oxide electric field for all cells in the array. The snapback generates a substrate current that reduces the electric field thereby reducing electron and hole trapping. The method for preventing cycling-induced electron and hole trapping in the tunneling oxide of flash EEPROM devices during an erase cycle comprises the steps of:
  a) applying a positive sine waveform voltage (Vs) to a source region of the EEPROM device during an entire erase cycle;
  b) grounding a substrate of the EEPROM device during an entire erase cycle;
  c) grounding a drain region of the EEPROM device during an entire erase cycle;
  d) simultaneously applying a negative voltage to a control gate of the EEPROM device during the entire erase cycle; and
whereby the positive sine waveform to the source region reduces an electric field when a snapback occurs in a tunnel oxide layer which reduces the electron and hole trapping.

The invention comprises a relatively high positive voltage sine waveform that is applied to the source (Vs). A relatively low negative voltage is applied to the gate side. The drain and P-substrate (or P-well or bulk) are grounded. The cell is driven to a snapback breakdown which changes the Tunnel oxide electric field and reduces the electron/hole (e/h)—trapping.

The snapback breakdown occurs as the electrical field of one cell in flash cell array reaches the critical electrical field (10 MilliVolts/cm). The snapback breakdown is caused by the vertical tunnel oxide magnetic field that generates F-N tunneling electron flow down the source junction. The electron are then accelerated by horizontal field Eh (See FIG. 4A) to generate a lot of electron-hole pairs in the substrate (e.g., hot carrier effect). The holes flow through the P-substrate 10 to forward bias the drain junction 14 and turn on the parasitic n-p-n bipolar 27. (See FIG. 4A). Therefore every cell can avoid the high field stress. Turning on the n-p-n bipolar reduces E tunnel in all the cell in the memory array. As the NPN bipolar 27 is turned on, the substrate potential drops, therefore reducing the E tunnel ($E_v$ and $E_h$). Note that to erase all cells in a large array (e.g., 64×64), a series of sine waves is applied because each sine wave only erases 1, 2 or 3 cells.

The sine waveform and snap back operation of the invention reduces electron and hole trapping in memory devices, such as flash EEPROM devices during erase cycles and thereby increases the performance of these devices.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1A shows a cross-sectional view of a conventional flash EEPROM cell, illustrating the trapped electrons in the tunneling oxide according to the prior art.

FIGS. 2A, 2B and 2C are conventional rectangular waveforms of the voltages applied to the respective control gate, source, and drain over the erase condition in accordance with the prior art.

FIGS. 3A, 3B, 3C, 3D, and 3E show the erase cycle voltage (including the sine waveform (Vs)) and gate current for the present invention.

DETAILED DESCRIPTION OF THE PREFERRED EMBODIMENTS

Figure 4A:
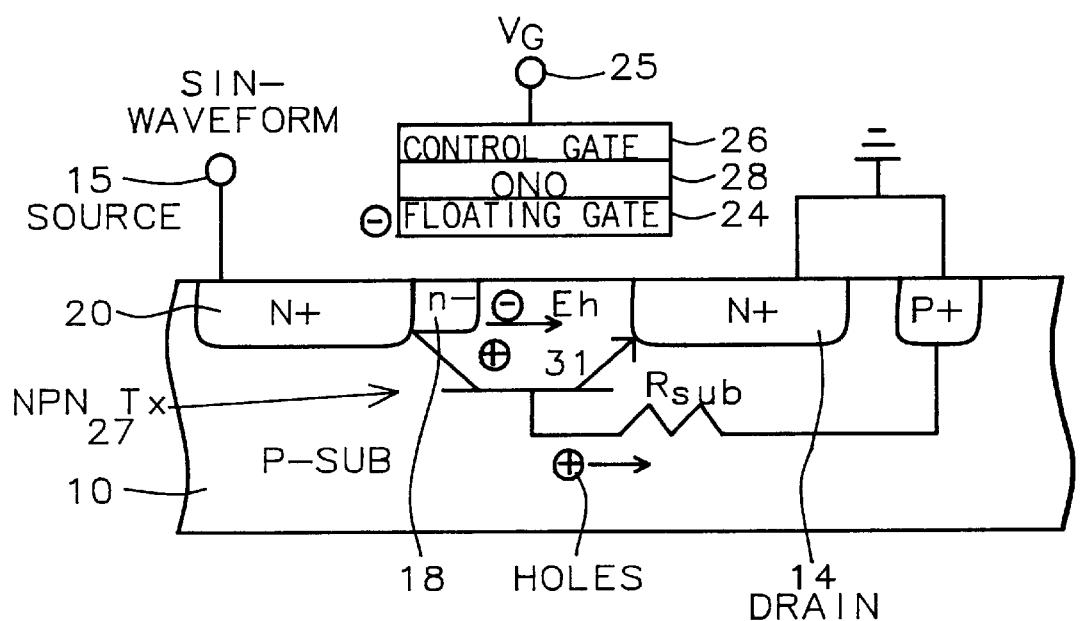
FIG. 4A shows an electrical schematic of the EEPROM cell during the snap back erase operation of the present invention.

The present invention will be described in detail with reference to the accompanying drawings. The present invention provides a method to erase and program flash EEPROMS devices using a sine waveform. See FIGS. 3A–3F. The sine waveform and snapback breakdown reduces the electric field in the tunnel oxide in all the cells in the array thereby reducing electron and hole trapping.

II. Erase Cycle of the Invention

The invention's erase cycle method for preventing cycling-induced electron and hole trapping in the tunneling oxide of flash EEPROM devices is illustrated in FIGS. 3A 3B 3C and 3D.

As shown in FIGS. 3A, 3B, 3C, 3D, and 3F the invention's erase cycle is uses a sine waveform to apply voltages Vs to the memory device. The preferred voltages of for a 5 V flash EEPROM erasing are given below in table 1:

TABLE 1

| Voltge and times for the Invention's Preferred Program and Erase cycles | | | | |
|---|---|---|---|---|
| Operation | Vg | Vd | Vs | V sub |
| Erase Cycle Voltages | −5 ≦ Vg ≦ −1 V | Ground | sine wave form max peak V range is +2 V to +12 V (tgt = 5 V Sine wave form) | Ground |

The preferred voltages and times may vary with tunnel oxide, gate oxide thickness, P-well doping and N+ doping implantation concentration. The table below shows the preferred values for Vs and Vg as a function of tunnel oxide thickness.

TABLE 2

Preferred Values For Vs And Vg As A Function Of Tunnel Oxide Thickness

| Tunnel oxide thickness (+/10Å) | 60Å | 100Å | 150Å |
|---|---|---|---|
| peak (maximum) sine wave voltage $V_s$ | 1 to 10 V | 2 to 12 V | 5 TO 15 V |
| control gate voltage Vg | −1 to −10 V | −1 to −15 V | −1 to −20 V |

The preferred period of the sine waveform Vs (shown in FIG. 3A) (i.e., only the positive part the sine wave cycle) of between 0.01 and 1000 ms for tunnel oxide thickness in a range of between about 50 and 160 Å. (See table 2 above).

TABLE 3

Preferred Parameters For 100 Å Tunnel Oxide

| Parameters | units | Low | target | High |
|---|---|---|---|---|
| Sine Vs time period (∩) | ms | 0.01 | 1 | 1000 |
| Vs (max of sine wave) | V | 2 | 5 | 12 |
| Vg | V | −1 | −10 | −15 |
| Vd | V | floating | floating | floating |
| Vsub/well | V | grounded | grounded | grounded |

In more detail, as shown in table 3 above, for the erase cycle the positive sine waveform voltage to the source region preferably has a magnitude in the range of between about 2 and 12 volts and a period (shown in FIG. 3A) (i.e., only the positive part the sine wave cycle) of between 0.01 and 1000 ms. The substrate (or well region $V_{well}$ or $V_{p\text{-}well}$) is preferably grounded (at about 0 volts). The negative pulsed voltage (Vg) to the control gate preferably has a peak magnitude in the range of between about −5 and −1 volts.

Table 4 below summarized the erase cycle of the invention and the theorized mechanisms.

TABLE 4

Summary of the Theorized Stages Of The Sine Wave Snapback Erasure Method Of The Invention.

Stage Erase operation 1  apply voltages as shown below:
   Vs Source: high positive voltage sine waveform
   Vg Gate: negative voltage
   Vd Drain: Ground
   Vsub Bulk: Ground
   Snapback occurs: --- Critical electrical Field (10 MV/cm)
2  the vertical field caused F–N tunneling electron -→ the source junction
3  the electrons → horizontal field → generates a lot of electron/hole pairs
4  The generated holes travel to the p-substrate → turn on the drain junction -- turn on the n-p-n bipolar Tx
   Results
   every cell can operate without the high field stress (<=10 MV/cm)

Stage 1—Apply Voltages to Create Snapback

As shown in the table 4 above, the transistor is biased to begin the erase cycle.

Stage 2: Snapback occurs:—Critical electrical Field (10 MV/cm)—the vertical field caused F-N tunneling of the electrons to the source junction The positive sine waveform Vs creates the vertical electric field (Ev) in the tunnel oxide (from the floating Gate to the source) reach the Critical electrical Field (10 MV/cm). At this point, the electrons that are trapped in the tunnel oxide and floating gate will tunnel using F-N mechanism from the tunnel oxide and floating gate to the source.

Compared to a conventional square wave form, the invention's sine waveform Vs is superior (makes the Ev reach 10 MV/cm smoother to cause snapback) because the electric field across the tunnel oxide is average, but for the square wave is a sudden stress. This stress caused defects and slows the erase operation.

The following is a brief explanation of the invention's snapback breakdown phenomena. When the electrical field of one cell in flash cell array reaches the critical electrical field (10 MV/cm), electrons in the channel will acquire more than about 1.5 eV of energy (due to the F-N current), and impact ionization can result upon their collision with the lattice and horizontal field (Eh). Electron-hole pairs are generated from such collisions, with the total number being exponentially dependent on the reciprocal of the electric field, $-1/E_{max}$. The electrons produced in this manner are either attracted to the drain (adding to the drain current). The generated holes, enter the substrate 10 and constitute a parasitic substrate current $I_{sub}$ (Process 53 in FIG. 4B). The substrate current is also called a low-level-avalanche multiplication effect.

Some of the holes that should constitute Isub are instead collected by the drain (i.e., instead of by the body contact), and this collected hole current causes a voltage drop in the substrate of about 0.6 V. This voltage drop turns on the substrate-drain PN junction to conduct. Electrons are injected from the drain 14 to the substrate, just like electrons injected from emitter to base of an npn transistor (the forward injection 52 shown in FIG. 4B). These extra injected electrons can, in turn, gain sufficient energy as they travel toward the source 20 to cause additional impact ionization and create new electron-hole pairs. This creates a positive-feedback mechanism that can sustain itself if the source voltage exceeds a certain value. This is called a snapback breakdown.

Stage 3—The Electrons→Horizontal Field→Generates Electron Hole Pairs

Figures 4B, 4C:
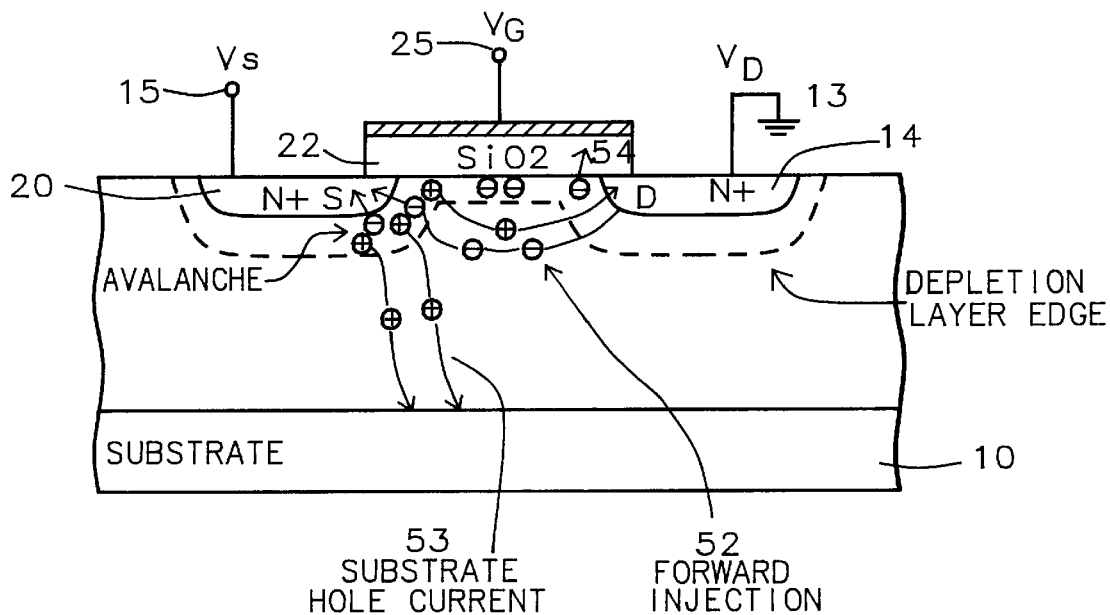
FIG. 4B shows an electrical schematic of the EEPROM cell during the hot carrier generation and snap back erase operation of the present invention.
FIG. 4C is a table identifying some of the processes shown in FIG. 4B.

As shown in FIGS. 4A and 4B, the invention's sine wave Vs causes the electrons and the horizontal field to generate the electron/hole pairs and thus a F-N tunneling current from the floating gate to the source junction. The electrons gain energy because of the horizontal filed (Eh) to penetrate the electron—hole pairs. The electrons generated by the (e-h) electron/hole pairs are attracted to the source, ad the hole generated by the e-h pairs are attracted to the substrate.

Stage 4—The Holes Travel to the P-Substrate→Turn On The Drain Junction—Turn On The N-P-N Bipolar The hole are generated in the substrate as show in the table 4 and are attracted to the drain 14 as shown in FIG. 4A.

The holes turn on the drain junction. The holes are drawn to the drain junction because of the grounded Vd. The hole current is caused by the potential drop on the p-substrate and the potential drop will turn on the drain junction.

As the snapback occurs, the source voltages are clamped, so every cell can operate without high field stress (less than 10 MV/cm). The holes (See stage 3) that travel from the substrate to the drain reduce the $E_{vert}$ to less than 10 MV/cm because of the clamped voltage. Also, as the snapback occurs, the gate current spikes (see FIG. 3e). At that time the tunnel oxide vertical field (Evert) is about 10 MV/cm.

The reduction in the $E_{vert}$ in the tunnel oxide reduces the electron and holes trapped at tunneling oxide. As the Evert is reduced, the F-N current will also decrease, and the electron/hole pairs generated by the F-N tunneling will be reduced. This will decrease the trapped electrons and holes.

The ease cycle of the invention is summarized in FIG. 4A and in the table below:

Snapback erase cycle of the invention (a) apply sine waveform Vs, Low Vcg
(b) EN tunneling begins Ev and Eh increase, and e-/holes pairs created
(c) holes flow into substrate and turn on diode 31
(d) Therefore high current flow starts between Drain and source, accelerated by Eh
(e) more electron/hole pairs produced and shapback breakdown occurs
(f) Vs clamped at fixed value
(g) advantage = keeps Ev at 10 MV/cm max so no tunnel oxide damage.

The reduced number of the trapped electrons and holes improves the endurance performance by ensuring that the E field will be below 10 MV/cm. The endurance is measured by P/E cycling. Only one, two or three cells of an array have to undergo the snap back in order to reduce the tunnel oxide $E_{vertical}$ for all the cells in the array.

The invention improves the erase time. The sine waveform and snapback operation of the invention reduces electron and hole trapping in memory devices, such as flash EEPROM devices during erase cycles and thereby increases the performance of these devices. The voltages for the erase cycles of the invention can be varied higher or lower depending on the configuration of the semiconductor device as is known to those skilled in the art. Also, the method of the invention can be applied to different voltage technology products as they are developed (e.g., 12 V to 5 V to 3.3 V, etc.). Moreover, the invention can be applied to both NMOS and PMOS devices.

While the invention has been particularly shown and described with reference to the preferred embodiments thereof, it will be understood by those skilled in the art that various changes in form and details may be made without departing from the spirit and scope of the invention.

What is claimed is:

1. A method for preventing cycling-induced electron and hole trapping in the tunneling oxide of a flash EEPROM device in an erase cycle, said flash EEPROM device comprising a source region, a drain region, a tunnel oxide layer, a control gate, and a floating gates in a substrate; said method comprising the steps of:
   a) applying a positive sine waveform voltage (Vs) to a source region of said EEPROM device during an entire erase cycle;
   b) grounding a substrate of said EEPROM device during said entire erase cycle;
   c) grounding a drain region of said EEPROM device during said entire erase cycle;
   d) simultaneously applying a negative voltage to a control gate of said EEPROM device during said entire erase cycle; and
whereby said positive sine waveform voltage applied to said source region reduces a electric field in a tunnel oxide layer which reduces the electron and hole trapping.

2. The method of claim 1 wherein said positive sine waveform voltage (Vs) to said source region has a peak magnitude in the range of between about +1 V and +15 volts;
   and said negative voltage applied to said control gate has a peak magnitude in the range of between about −1 and −20 volts; and
   said source and said regions have a n-type doping, said substrate has a p-type doping.

3. The method of claim 1 wherein said tunnel oxide layer has a thickness in a range of between about 90 and 110 Å;
   said positive sine waveform voltage to said source region has a peak magnitude in the range of between about +2 V and +12 volts and has a period in a range of between about 0.01 and 1000 milliseconds;
   and said negative voltage applied to said control gate has a peak magnitude in the range of between about −1 and −15 volts; and
   said source and said regions have a n-type doping, said substrate has a p-type doping.

4. The method of claim 1 wherein said tunnel oxide layer has a thickness in a range of between about 50 and 70 Å;
   said positive sine waveform voltage to said source region has a peak magnitude in the range of between about +2 and +12 volts and has a period in a range of between about 0.01 and 1000 milliseconds;
   and said negative voltage applied to said control gate has a peak magnitude in the range of between about −1 and −10 volts; and
   said source and said regions have a n-type doping, said substrate has a p-type doping.

5. The method of claim 1 wherein said tunnel oxide layer has a thickness in a range of between about 140 and 160 Å;
   said positive sine waveform voltage applied to said source region has a peak magnitude in the range of between about +2 and +15 V volts and has a period in a range of between about 0.01 and 1000 milliseconds;
   and said negative voltage applied to said control gate has a peak magnitude in the range of between about −1 and −20 volts; and
   said source and said drain regions have a n-type doping, said substrate has a p-type doping.

6. The method of claim 1 wherein said substrate further comprises a p-well surrounding said flash EEPROM device, and
   grounding said p-well during an entire erase cycle.

7. A method for preventing cycling-induced electron and hole trapping in the tunneling oxide of flash EEPROM devices in an erase cycle, said flash EEPROM devices comprising a source region, a drain region, a tunnel oxide layer, a control gate, and a floating gate, in a substrate; said source and said regions have a n-type doping, said method comprising the steps of:
   a) applying a positive sine waveform voltage (Vs) to a source region of said EEPROM device during an entire erase cycle; said positive sine waveform voltage (Vs) has a peak magnitude in the range of between about +1 V and +15 volts;
   b) grounding a substrate of said EEPROM device during said entire erase cycle;
   c) grounding a drain region of said EEPROM device during said entire erase cycle;
   d) simultaneously applying a negative voltage to a control gate of said EEPROM device during said entire erase cycle; and said negative voltage applied to said control gate has a peak magnitude in the range of between about −1 and −20 volts;
whereby said positive sine waveform voltage applied to said source region drives said EEPROM device into a snap breakdown that reduces a electric field in a tunnel oxide layer which reduces the electron and hole trapping.

8. The method of claim 7 wherein said tunnel oxide layer has a thickness in a range of between about 90 and 110 Å;
   said positive sine waveform voltage to said source region has a peak magnitude in the range of between about +2 and +12 volts and has a period in a range of between about 0.01 and 1000 milliseconds;

and said negative voltage applied to said control gate has a peak magnitude in the range of between about −1 and −15 volts.

9. The method of claim 7 wherein said tunnel oxide layer has a thickness in a range of between about 50 and 70 Å;

said positive sine waveform voltage to said source region has a peak magnitude in the range of between about +2 and +12 volts and has a period in a range of between about 0.01 and 1000 milliseconds;

and said negative voltage applied to said control gate has a peak magnitude in the range of between about −1 and −10 volts.

10. The method of claim 7 wherein said tunnel oxide layer has a thickness in a range of between about 140 and 160 Å;

said positive sine waveform voltage applied to said source region has a peak magnitude in the range of between about +2 V and +15 V volts and has a period in a range of between about 0.01 and 1000 milliseconds;

and said negative voltage applied to said control gate has a peak magnitude in the range of between about −1 and −20 volts.

11. The method of claim 7 wherein said substrate further comprises a p-well surrounding said flash EEPROM device, and grounding said p-well during an entire erase cycle.

12. A method for preventing cycling-induced electron and hole trapping in the tunneling oxide of flash EEPROM devices in an erase cycle, said flash EEPROM devices comprising a source region, a drain region, a tunnel oxide layer, a control gate, and a floating gate, in a substrate; said source and said regions have a n-type doping, said method comprising the steps of:

a) applying a positive sine waveform voltage (Vs) to a source region of said EEPROM device during an entire erase cycle so to accomplish an averaging electric field in said tunnel oxide of less than about 10 MV; said positive sine waveform voltage (Vs) has a peak magnitude in the range of between about +2 and +12 volts, and a period in a range of between about 0.01 and 1000 milliseconds b) grounding a substrate of said EEPROM device during said entire erase cycle;

c) grounding a drain region of said EEPROM device during said entire erase cycle;

d) simultaneously applying a negative voltage to a control gate of said EEPROM device during said entire erase cycle; and said negative voltage applied to said control gate has a peak magnitude in the range of between about −1 and −15 volts;

e) said tunnel oxide layer having a thickness in a range of between about 90 and 110 Å;

f) said positive sine waveform voltage driving said EEPROM device into a snap breakdown that reduces a electric field in a tunnel oxide layer which reduces the electron and hole trapping.

* * * * *

UNITED STATES PATENT AND TRADEMARK OFFICE
CERTIFICATE OF CORRECTION

PATENT NO. : 5,828,605
DATED : 10/27/98
INVENTOR(S) : Kuo-Peay Peng, Jian-Hsing Lee, Juang-Ke Yeh, and Ming-Chon Ho It is certified that error appears in the above-identified patent and that said Letters Patent is hereby corrected as shown below:

On the Cover Page, at (75), delete "Japan" and replace with --TAIWAN--.

Signed and Sealed this

Seventh Day of September, 1999

Attest:

Q. TODD DICKINSON

Attesting Officer

Acting Commissioner of Patents and Trademarks